United States Patent
Tanaka et al.

(10) Patent No.: US 6,334,922 B1
(45) Date of Patent: Jan. 1, 2002

(54) COATING METHOD UTILIZING A POLYMER FILM AND METHOD OF MAKING METAL-POLYMER LAMINATES

(75) Inventors: Yoshinobu Tanaka; Takeichi Tsudaka; Minoru Onodera; Toshiaki Sato, all of Kurashiki (JP)

(73) Assignee: Kuraray Co., Ltd., Kurashiki (JP)

( * ) Notice: Subject to any disclaimer, the term of this patent is extended or adjusted under 35 U.S.C. 154(b) by 0 days.

(21) Appl. No.: 09/283,867

(22) Filed: Apr. 1, 1999

(30) Foreign Application Priority Data

Apr. 9, 1998 (JP) .......................... 10-097561

(51) Int. Cl.⁷ .......................... B32B 31/08; B32B 7/00; B32B 15/08; C09K 19/00; C09K 19/04
(52) U.S. Cl. .................. 156/234; 156/238; 156/247; 156/254; 156/344; 118/35; 428/1.1; 428/1.2; 428/1.6; 428/458
(58) Field of Search ............... 156/230, 231, 156/233, 234, 238, 241, 244.11, 247, 254, 344; 427/96, 103, 117, 120, 146, 147, 148; 118/35, 76; 428/86, 457, 458, 1.1, 1.2, 1.6

(56) References Cited

U.S. PATENT DOCUMENTS

| | | | |
|---|---|---|---|
| 3,360,422 A | 12/1967 | Desch | 161/89 |
| 3,813,315 A * | 5/1974 | Valyi | 156/254 |
| 4,837,268 A | 6/1989 | Matsumoto et al. | 524/539 |
| 4,851,503 A | 7/1989 | Matsumoto et al. | 528/176 |
| 4,983,318 A | 1/1991 | Matsumoto et al. | 252/299.01 |
| 5,066,348 A * | 11/1991 | Manning | 156/164 |
| 5,091,138 A | 2/1992 | Ishii et al. | 264/564 |
| 5,326,848 A | 7/1994 | Kashimura et al. | 528/190 |
| 5,360,672 A | 11/1994 | Saito et al. | 428/480 |
| 5,529,740 A | 6/1996 | Jester et al. | 264/317 |
| 5,703,202 A | 12/1997 | Jester et al. | 528/481 |
| 5,719,354 A | 2/1998 | Jester et al. | 174/255 |
| 5,843,562 A | 12/1998 | Onodera et al. | 428/141 |
| 6,027,771 A * | 2/2000 | Moriya | 428/1 |
| 6,124,004 A * | 9/2000 | Furuta et al. | 428/1.1 |

FOREIGN PATENT DOCUMENTS

| | | |
|---|---|---|
| EP | 0 507 332 | 10/1992 |
| EP | 0 697 278 | 2/1996 |

* cited by examiner

Primary Examiner—Richard Crispino
Assistant Examiner—J. A. Lorengo
(74) Attorney, Agent, or Firm—Oblon, Spivak, McClelland, Maier & Neustadt, P.C.

(57) ABSTRACT

A coating layer of a polymer capable of forming an optically anisotropic melt phase is formed by heat-pressing to a base material a film made of the polymer and having a segment orientation ratio of not greater than 1.3 and then separating the film into two halves so as to leave one of the halves on the base material, thereby obtaining a coated material made of the base material and the thin coating layer.

6 Claims, 4 Drawing Sheets

COATING METHOD UTILIZING A POLYMER FILM AND METHOD OF MAKING METAL-POLYMER LAMINATES

BACKGROUND OF THE INVENTION

1. Field of the Invention

The present invention relates to a coated material having an isotropic coating layer that is obtained by peeling a portion of a film press-fitted to a base material such as a metal foil and made of a polymer capable of forming an optically anisotropic melt phase, and a method of making the coated material. The present invention also relates to a metal-polymer laminate obtained by peeling a portion of the polymer film firmly sandwiched between metal foils, in a direction thicknesswise thereof, and a method of making the metal-polymer laminate.

In the description of the present invention, the polymer capable of forming an optically anisotropic melt phase is referred to as a "liquid crystal polymer"; the film made of the liquid crystal polymer is referred to as a "liquid crystal polymer film"; and the coated material is intended to mean an article of manufacture formed with the liquid crystal polymer coating layer by coating the liquid crystal polymer to the base material.

2. Description of the Prior Art

The liquid crystal polymer has been well known which has various advantageous features including (1) a capability of being thermally bonded directly to a metallic foil layer; (2) a high resistance to heat; (3) a low moisture absorbability; (3) an excellent dimensional stability to thermal change in size; (5) an excellent resistance to change in size brought about by moisture; (6) an excellent property in high frequency characteristic; (7) a fire-proof property with no need to add a flame retardant containing a toxic halogen, phosphorus, antimony and others; (8) an excellent resistance to chemicals; (9) an excellent resistance to radiations; (10) having a controllable thermal expansion coefficient; (11) a flexibility at low temperatures; (12) a property of a high gas barrier (a considerably low permeability to a gaseous material such as, for example, oxygen), and so on.

In recent years, demands have been arisen to use such excellent liquid crystal polymer as a coating material to be applied in the form of a thin film to a metallic foil layer, a silicon plate or a ceramics plate to provide a base material for a precision circuit substrate, a multi-layered circuit substrate, a sealing material or a package can. In addition, because of the resistance to heat and chemicals, the low moisture absorbability and the gas barrier property, demands have increased for the use of the liquid crystal polymer as a coating material that can be utilized to form a protective layer on a metal susceptible to corrosion.

The first problem in utilizing the liquid crystal polymer as a coating material will first be discussed:

To form a thin skin film of, for example, a synthetic resin over the surface of an article of manufacture, various methods have been known such as, for example, a lining process and a coating process. The lining process and the coating process are known to be distinct from each other because of the following reasons. Specifically, the coating process has a primary objectivity in decorative purpose to form a continuous skin film over the article to thereby protect the article from corrosion and contamination and also to provide the article with an appealing ornament and is also often used to form a film for imparting a non-adhesive property and a low frictional property. On the other hand, the lining process is a process of forming a protective thick film on vessels (baths) and tubes or pipes that are used in the chemically and/or physically severe environment where corrosion and/or erosion are strictly desired to be avoided. However, the coating and lining processes have features so common to each other that the line of distinction can hardly be drawn therebetween. It is generally recognized that the skin layer having a thickness of 0.5 mm or more is classified as a lining whereas the skin film having a thickness of 0.5 mm or less is classified as a coating. It is also generally recognized that the coating is to form a film of several tens microns mainly on a surface of a structure whereas the lining is to form a film of several hundreds microns.

In either case, the present invention pertains to a technique of forming on a base material a very thin film of a liquid crystal polymer to a thickness of 25 $\mu$m or less, particularly 15 $\mu$m or less and may therefore be said to pertain to the coating technique.

As one of important properties of the coating, attention is centered on the durability of the coating against change in temperature and, however, this leads to a problem of how the difference in thermal expansion coefficient between the coating and the base material bearing the coating should be resolved. While the coating process includes, inter alia, (1) a dipping method, (2) a flow coating method, (3) a curtain coating method, (4) a roll coating method, (5) an electrodeposition method, (6) a brush coating method, (7) a spray coating method and (8) a gas-phase coating method, none of these known methods can be utilized to form a film of a liquid crystal polymer by the following reason. Specifically, due to a unique property of the liquid crystal polymer in that molecules of the liquid crystal polymer have a propensity of orienting in the same direction, the liquid crystal polymer molecules tend to be oriented in the same direction when a force is applied to a molten liquid crystal polymer being applied to form a thin film. Considering that the physical property such as thermal expansion coefficient measured in a direction conforming to the molecular orientation is considerably different from that measured in a direction transverse to the molecular orientation, that is, the liquid crystal polymer has an anisotropy, it is impossible to render the coating-bearing base material and the layer of the liquid crystal polymer to have the same or substantially same thermal expansion coefficient in all directions on a plane. Although the prior art coating process is capable of providing a liquid crystal polymer layer of a large thickness of, for example, 50 $\mu$m or more, it has been found that the resultant liquid crystal polymer layer has an anisotropy and is therefore incapable of being used as a practically utilizable coating. Nonetheless, no technique of forming a layer of a liquid crystal polymer having an improved isotropy to a thickness of 15 $\mu$m or less have hitherto been made available.

The second problem will now be discussed:

Circuit substrates or the like that are generally utilized in the field of electronics make use of a metal-resin laminate prepared by press-bonding together a foil layer of an electroconductive metal and a film-like insulating material (a film or a sheet with or without a metallic foil layer coated thereon) having an electrically insulating property. The metal-resin laminate is available in the form of a double-sided metal-resin laminate in which an electric insulating layer is sandwiched between two metallic foil layers and of a single-sided met al-resin laminate in which a single metallic foil layer and a single electric insulating layer are bonded together. The liquid crystal polymer having the excellent properties as discussed above is generally recognized as an ideal material for the electric insulating layer used in the laminates.

As a method of making a metal-polymer laminate without diminishing the excellent properties of the liquid crystal polymer, various methods have been well known. (i) Specifically, in the case of the double-sided metal-polymer laminate, the method is known to comprise sandwiching a liquid crystal polymer layer between two metallic foil layers, and hot-pressing the resultant sandwich structure with the use of a hot plate or a hot roll to cause the liquid crystal polymer to melt so that the metallic foil layers and the liquid crystal polymer layer can be thermally bonded together to eventually provide the double-sided metal-polymer laminate upon solidification of the liquid crystal polymer. (ii) On the other hand, in the case of the single-sided metal-polymer laminate, the method is known to comprise sandwiching a liquid crystal polymer layer between a single metallic foil layer and a single release film, hot-pressing the resultant sandwich structure with the use of a hot plate or a hot roll to cause the liquid crystal polymer to melt so that the metallic foil layer and the liquid crystal polymer layer can be thermally bonded together, and removing the release film to leave the resultant single-sided metal-polymer laminate.

While the prior art method of making the double-sided metal-polymer laminate is satisfactory, the prior art method of making the single-sided metal-polymer laminate has a problem in that since the release film has to be removed and is then discarded, manufacture of the single-sided metal-polymer laminate tends to be costly. Moreover, since a high temperature of about 300° C. is required to melt the liquid crystal polymer in the practice of making the single-sided metal-polymer laminate, the release film used must be chosen from highly heat-resistant films made of an expensive resinous material such as, for example, Teflon® or polyimide, and increase of the manufacturing cost brought about by the use of the expensive release film has made it very difficult to manufacture the single-sided metal-polymer laminate on a commercially profitable basis.

On the other hand, demand has arisen particularly from electronics concerns for availability of circuit substrates having a more reduced thickness. Since as discussed hereinabove the liquid crystal polymer is suited as a material for the electric insulating layer, realization of a circuit substrate comprising a thin layer of the liquid crystal polymer and a thin foil layer of metal is persistently longed for.

Although a film of the liquid crystal polymer is often required for the thin liquid crystal polymer layer, the liquid crystal polymer film if manufactured in a usual manner would have a molecular orientation dominantly in one direction. The film having the molecular orientation dominantly in one direction tends to be easily torn in a direction parallel to the molecular orientation and also tends to exhibit considerably differing thermal changes in shape in respective directions parallel to and transverse to the molecular orientation, that is, to exhibit an anisotropic film. Therefore the liquid crystal polymer hitherto available in the market can hardly be used as a material for the electric insulating layer in the circuit substrate. However, as discussed in connection with the first problem, it is difficult to form a film having a thickness of 15 µm or less with an isotropic liquid crystal polymer for use as a material for the electric insulating layer, and much difficulty has hitherto been encountered to form a film having a thickness of 10 µm or less. No report has hitherto been made yet which show a success in making the isotropic liquid crystal polymer film having a film thickness not greater than 10 µm.

SUMMARY OF THE INVENTION

Accordingly, the present invention has been devised with a view to substantially eliminating the above discussed first problem inherent in the prior art coating methods and is intended to provide a means for forming the liquid crystal polymer coating, particularly the liquid crystal polymer coating having a reduced thickness, in which a problem associated with the anisotropic molecular orientation is resolved, that is, having an improved isotropy to thereby substantially eliminate the first problem discussed hereinbefore.

Another important object of the present invention is to provide an improved method of making the single-sided metal-polymer laminate in which no release film is required, to thereby substantially eliminate the second problem discussed hereinbefore.

A further important object of the present invention is to provide an improved laminate comprising a metallic foil layer and an electric insulating layer prepared from the liquid crystal polymer from which a problem associated with the anisotropic molecular orientation is resolved.

According to the coating method of the present invention, a film prepared from a liquid crystal polymer and having a segment orientation ratio (SOR) of not greater than 1.3 is hot-pressed and, hence, bonded to a base material to provide a layered structure. The liquid crystal polymer film is subsequently peeled off from the layered structure so as to leave a thin ply of the liquid crystal polymer on the base material. In this way, a thin liquid crystal polymer coating can easily be obtained.

A coated material having a thin coating of the liquid crystal polymer left on the base material according to the present invention comprises a coating of the liquid crystal polymer capable of forming a melt layer having an optically anisotropy, in which the segment orientation ratio of the liquid crystal polymer coating is not greater than 1.3. In a preferred embodiment of the coated material of the present invention, the coating layer referred to above has a thickness not greater than 15 µm. Accordingly, the coating in the coated material of the present invention has an isotropic molecular orientation while securing a small thickness, and therefore, the coated material of the present invention can advantageously be used as a material for the precision circuit substrates, the multi-layered circuit substrates, sealing members, package cans with maximized utilization of the excellent properties of the liquid crystal polymer discussed hereinbefore.

The term "segment orientation ratio" used hereinbefore and hereinafter is an index descriptive of the degree of orientation of molecules forming a segment and represents, unlike the standard MOR (molecular orientation ratio), a value in which the thickness of an object is taken into consideration. This segment orientation ratio can be calculated in the following manner.

Figure 6:
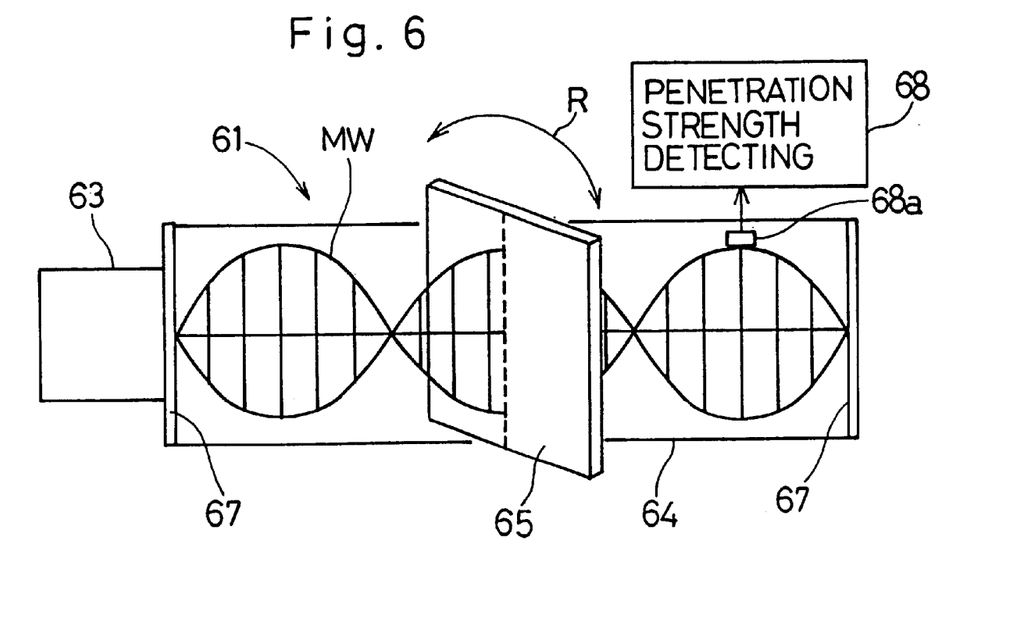
FIG. 6 is a schematic side view showing a measuring apparatus for measuring the segment orientation ratio.

Using a commercially available microwave molecular orientation degree measuring apparatus shown in FIG. 6 and available from the KS Systems Corporation, the intensity (the microwave penetration strength) of an electric field of the microwaves transmitted through a liquid crystal polymer film is first measured.

The measuring apparatus indicated by 61 in FIG. 6 comprises a microwave generator 63 capable of generating microwaves MW of a predetermined wavelength that irradiate a liquid crystal polymer film 65, a microwave resonant waveguide 64 and a penetration strength detecting means 68. The microwave resonant waveguide 64 has an intermediate portion thereof at which the liquid crystal polymer film 65 is set so as to lie vertically with respect to the direction of propagation of the microwaves MW. The liquid crystal polymer film 65 so placed is retained for rotation in the direction R in a plane perpendicular to the direction of propagation of the microwaves MW by means of a rotary drive mechanism (not shown). The microwave resonant waveguide 64 includes a pair of reflecting mirrors 67 disposed at respective opposite ends of the waveguide 64 for reflecting the microwaves MW penetrating through the liquid crystal polymer film 65 to allow the waveguide 64 to undergo resonance. The strength of the microwaves which have penetrated through the liquid crystal polymer film 65 can be detected by the penetration strength detecting means 68. This penetration strength detecting means 68 includes a detecting element 68a disposed at a predetermined position rearwardly within the microwave resonant waveguide 64 to measure the microwave penetration strength.

Based on the resultant measurement, an m value (hereinafter referred to as an "index of refraction") can be calculated from the following equation:

$$m = (Z_0/\Delta z) \times (1 - v_{max}/v_0)$$

wherein $Z_0$ represents a device constant, $\Delta z$ represents an average thickness of an object subjected to the measurement, $v_{max}$ represents the frequency at which the maximum microwave penetration strength can be obtained when the frequency of the microwaves is changed, and $v_0$ represents the frequency at which the maximum microwave penetration strength can be obtained when the average thickness is zero, that is, when no object is present.

The segment orientation ratio (SOR) can be calculated from the following equation:

$$SOR = m_0/m_{90}$$

wherein $m_0$ represents a value of the m value which is exhibited when the angle of rotation of the object in a direction indicated by R in FIG. 6 relative to the direction of oscillation of the microwaves is 0°, that is, when the direction of oscillation of the microwaves is aligned with the direction in which molecules of the object are most oriented and in which the minimum microwave penetration strength is exhibited, and $m_{90}$ represents a value of the m value which is exhibited when the angle of rotation of the object in the direction R is 90°.

The SOR of ideal isotropic films exhibits 1, while the SOR of a liquid crystal polymer film prepared by the use of the standard T-die film forming method and in which molecules are oriented strongly in one direction exhibits about 1.5. The SOR of the isotropic film obtained by the use of the standard isotropic inflation film forming method is not greater than 1.3.

The liquid crystal polymer includes all kinds of liquid crystal polymer such as Half-1 liquid crystal polymer, Whole-1 liquid crystal polymer, Half-2 liquid crystal polymer, and Whole-2 liquid crystal polymer. See "Seikei·Sekkei no tameno Ekisho Porimah (Liquid Crystal Polymer for Molding and Design)" authored by Junichi Suenaga and available from the Sigma Publishing Co.

In any event, examples of the liquid crystal polymer include, for example, well known thermotropic liquid crystal polyester and thermotropic liquid crystal polyester amide prepared from compounds, such as classified under (1) to (4) below, and their derivatives. It is, however, pointed out that to prepare a liquid crystal polymer, various raw material compounds have their proper combination and amount carefully chosen.

(1) Aromatic or aliphatic dihydroxy compounds, representative examples of which are shown in Table 1 below.

TABLE 1

Chemical formulas of the representative examples of aromatic or aliphatic dihydroxy compounds

(X: hydrogen atom or halogen atom, or lower alkyl, phenyl or like groups)

(Y: —O—, —CH$_2$—, —S— or like groups)

HO(CH$_2$)$_n$OH (n: an integer from 2 to 12)

(2) Aromatic or aliphatic dicarboxylic acids, representative examples of which are shown in Table 2 below.

TABLE 2

Chemical formulas of the representative examples of aromatic or aliphatic dicarboxylic acids TABLE 2-continued Chemical formulas of the representative examples
of aromatic or aliphatic dicarboxylic acids HOOC(CH$_2$)nCOOH (n: an integer from 2 to 12)

(3) Aromatic hydroxycarboxylic acid, representative examples of which are show in Table 3 below.

TABLE 3

Chemical formulas of the representative examples
of aromatic hydroxycarboxylic acids (X: hydrogen atom or halogen atom, or lower alkyl, phenyl or like groups)

TABLE 3-continued

Chemical formulas of the representative examples
of aromatic hydroxycarboxylic acids

(4) Aromatic diamines, aromatic hydroxyamines and aromatic aminocarboxylic acids, representative examples of which are shown in Table 4 below.

TABLE 4

Chemical formulas of representative examples of aromatic
diamines, aromatic hydroxyamines and aromatic aminocarboxylic acids (5) Representative examples of the liquid crystal polymers prepared from any of those starting material compounds include copolymers having such structural units as indicated by (a) to (e) in Table 5 below.

TABLE 5

Structural units of the representative examples of liquid crystal polymers

TABLE 5-continued

Structural units of the representative examples of liquid crystal polymers (X: —O—, —CH$_2$—, —S— or like groups)

Those liquid crystal polymers preferably have a transition temperature to an optically anisotropic melt phase within the range of from about 200 to about 400° C., more preferably from about 250 to about 350° C., so that the resultant film can have a desirable heat resistance and a desirable processability. Unless physical properties of the liquid crystal polymer film are impaired, one or a mixture of various additives such as a smoothing agent, an antioxidant and a filler may be added thereto if desired.

The film prepared from any of those liquid crystal polymers discussed above can be made by the use of one or a combination of the well-known T-die process and the well-known inflation process. Particularly with the inflation method, stresses can be applied not only in a direction of the mechanical axis of the film (which direction is hereinafter referred to as the MD direction), but also in a direction (hereinafter referred to as TD direction) perpendicular to the MD direction and, therefore, the inflation method is effective to eventually manufacture the liquid crystal polymer film having balanced physical and thermal properties in both of the MD and TD directions.

Accordingly, one of important features of the present invention lies in the use of the isotropic liquid crystal polymer film as a coating material, and even if the anisotropic liquid crystal polymer film having the segment orientation ratio (SOR) greater than 1.3 is used as a coating material and even if after this coating material has been applied, the anisotropic liquid crystal polymer coating layer is heated to melt, this will not transform into an isotropic liquid crystal polymer coating layer. This is a fundamental behavior of molecules of the liquid crystal polymer, and the inventors of the present invention have experimentally confirmed that even though the anisotropic liquid crystal polymer coating layer is heated to a temperature 35° C. higher than the melting point of the liquid crystal polymer, it would not transform into the isotropic liquid crystal polymer.

The base material to which the liquid crystal polymer film is applied may be made of any inorganic material such as, for example, metal, glass or ceramics, or any organic material such as, for example, plastics, wood, textile fibers, provided that those materials have a softening point higher than the temperature at which the liquid crystal polymer is fusion-bonded thereto. It is to be noted that the liquid crystal polymer itself can be included as a material for the base material. By way of example, for the purpose of improving surface characteristics (such as, for example, bondability, physical properties, frictional resistance, surface wettability, gas barrier property, resistance to chemicals, resistance to solvents, affinity to solvents, aesthetic appearance and so on) of the base material mixed with a reinforcement such as filler or glass cloth or without filler or glass cloth, the liquid crystal polymer coating layer may be provided on the surface of the base material.

In particular, the liquid crystal polymer coating layer of the present invention is suited for retention of electronic components or electronic circuits forming an electronic board and, in such cases, the metallic foil layer may often comprise the base material. Material for the metallic foil may be selected from metals of a kind used in electric connections and is preferably chosen from the group consisting of, for example, gold, silver, copper, nickel, aluminum, iron, steel, tin, brass, magnesium, molybdenum, a copper-nickel alloy, a copper-beryllium alloy, a nickel-chromium alloy, a silicon carbide alloy, graphite and a mixture thereof.

Another one of the important feature of the present invention lies in that after a film of the isotropic liquid crystal polymer has been hot-pressed to the base material, the film is peeled off from the base material so as to leave a thin film of the liquid crystal polymer on the base material. While this is difficult with ordinary polymers, this type of coating can be accomplished only when the intra-layer separability which is a unique property of the liquid crystal polymer film is utilized. The term "intra-layer separability" means a capability of the liquid crystal polymer film being internally separated to produce mica-like thin flakes of liquid crystal polymer. In order for the isotropic liquid crystal polymer film to be hot-pressed and, hence, fusion-bonded to the base material while making maximized use of the excellent intra-layer separability, the heating temperature should not be increased to a value equal to or higher than the melting point of the liquid crystal polymer.

The liquid crystal polymer coating layer so formed on the surface of the base material by the method described above may, when subsequently heated to the temperature not lower than the melting point, loose the intra-layer separability. Also, where after the liquid crystal polymer coating layer and any other material have been overlapped together in face-to-face relation with each other the base material and such any other material are hot-pressed together at a temperature not lower than the melting point of the liquid crystal polymer, no intra-layer separation occur in the liquid crystal polymer coating layer since the liquid crystal polymer coating layer is heated to a temperature not lower than the melting point thereof during a hot-pressing process.

The coated material having the isotropic liquid crystal polymer according to the present invention has the liquid crystal polymer coating layer which preferably has a thickness not greater than 15 $\mu$m.

The film forming method for forming the liquid crystal polymer film is one of the high-tech methods and manufacture of the thin film is difficult to accomplish without incurring an increase in manufacturing cost. In general, manufacture of the liquid crystal polymer coating layer of 20 $\mu$m or greater is relatively easy and, depending on the circumstances, the liquid crystal polymer coating layer can be obtained by a simple manufacture which does not require a peeling process to induce the intra-layer separation. Nevertheless, it is often considered important to prepare the liquid crystal polymer coating layer of 20 $\mu$m or greater in thickness through the peel-off process since when the thick liquid crystal polymer coating layer is internally separated by peeling off, the coating layer will have a rough surface effective to retain a bonding material.

However, the coated material according to the present invention is effectively utilized where in its application to the electronic circuit substrates and their related component parts a thin liquid crystal polymer coating layer is required. Accordingly, in order to provide the isotropic liquid crystal polymer coating layer particularly having a thickness not greater than 20 $\mu$m, preferably not greater than 15 $\mu$m, the coating method herein disclosed and claimed in accordance with the present invention is the sole effective method to accomplish it. With the coating method of the present invention, the liquid crystal polymer coating layer may have an extremely small average thickness, the minimum value of which is close to zero, and the liquid crystal polymer coating layer having an average thickness of, for example, 1 $\mu$m or smaller can easily be manufactured. Under precisely controlled conditions, it is possible to manufacture the isotropic liquid crystal polymer coating layer having an average thickness of 0.1 $\mu$m or smaller.

In the coated material having the isotropic liquid crystal polymer coating layer according to the present invention, the isotropic liquid crystal polymer coating layer and the base material on which the isotropic liquid crystal polymer coating layer is applied preferably have the same or substantially same thermal expansion coefficient.

As discussed in connection with the problems inherent in the prior art, the thermal expansion coefficient of the liquid crystal polymer coating layer is preferably as close to that of the base material as possible. In particular, if the dimensional change between the base material and the coating layer relative to a temperature change of 100° C. is 0.2% or less, the liquid crystal polymer coating layer can satisfactorily be used as a precise coating material for the electronics component parts. Accordingly, the fact that the thermal expansion coefficient of the isotropic liquid crystal polymer coating layer and that of the base material are substantially equal to each other speaks of ±20 ppm/° C. (that is, ±(2/1, 000)%/° C.). Thus, the simplest method to render the thermal expansion coefficient of the liquid crystal polymer coating layer to be as close to that of the base material as possible is to make the thermal expansion coefficient of the liquid crystal polymer film, which serves as a material for the coating layer, equal to that of the base material. However, even though the liquid crystal polymer film and the base material have respective thermal expansion coefficients different from each other, heat treatment of the liquid crystal polymer coating layer formed by the use of the liquid crystal polymer film is effective to render the respective thermal expansion coefficients to be substantially equal to each other. If during the heat treatment the heating temperature is very precisely controlled, it is possible to allow the base material and the coating layer to have the respective thermal expansion coefficients which substantially match with each other within a measurement tolerance. In order to control the thermal expansion coefficient where the standard thermoplastic polymer having no liquid crystal phase or the standard thermosetting resin such as epoxy resin is employed for the coating layer, special operations are required to add an inorganic powder or an inorganic cloth to the coating layer, and to control the proportion of the additive in the coating layer or to control the cross-linking density of polymer molecules forming the coating layer. However, in the case of the liquid crystal polymer coating layer, it can easily be accomplished with the simple heat treatment owing to the unique properties of the liquid crystal polymer molecules.

As described above, the present invention makes use of the unique feature of the liquid crystal polymer in which the molecules of the liquid crystal polymer can easily be oriented and can exhibit the excellent intra-layer separability when formed into a film. Because of this, the thin liquid crystal polymer coating layer of the present invention can be easily formed by initiating the intra-layer separation when the liquid crystal polymer film hot-pressed to the surface of the base material is being peeled off from the base material, so as to leave a fraction of the thickness of the liquid crystal polymer film on the base material.

The method of making the metal-polymer laminate of the present invention which will be described subsequently is closely associated with the liquid crystal polymer coating method of the present invention in that the intra-layer separability of the liquid crystal polymer is utilized, provided that the base material in the above described liquid crystal polymer coating comprises a metallic foil.

The method of making the single-sided metal-polymer laminate according to the present invention can be practiced by separating the double-sided metal-polymer laminate, which comprises the layer of the liquid crystal polymer having its opposite surfaces bonded with upper and lower metallic foils, into first and second single-sided metal-polymer laminates. The resultant first single-sided metal-polymer laminate comprises the upper metal foil having a lower surface to which a portion of the liquid crystal polymer layer is bonded whereas the resultant second single-sided metal-polymer laminate comprises the lower metal foil having an upper surface to which the remaining portion of the liquid crystal polymer layer is bonded. Thus, with no need to use such release film hitherto required in the practice of the prior art method, not only can the single-sided metal-foil laminates be easily obtained, but also two single-sided metal-foil laminates can be obtained at a time through a single peel-off process and the speed of manufacture of the laminate is accordingly substantially twice that required to manufacture the single laminate.

In the practice of the single-sided metal-polymer laminate making method of the present invention, the double-sided metal-polymer laminate is preferably made by sandwiching the liquid crystal polymer film between two metallic foils to provide a sandwich structure which is subsequently hot-pressed by means of a hot-press. The single-sided metal-polymer laminates according to the present invention are manufactured by means of the method of the present invention described hereinabove.

The single-sided metal-polymer laminate of the present invention includes the liquid crystal polymer layer having a thickness preferably not greater than 15 $\mu$m. Also, the liquid crystal polymer layer in the single-sided metal-polymer laminate of the present invention has a segment orientation ratio (SOR) which is preferably not greater than 1.3.

The parts-mounted circuit board of the present invention makes use of the above described single-sided metal-polymer laminate on which electronic component parts are mounted and connected electrically.

The multi-layered parts-mounted circuit board of the present invention is of a structure in which the single-sided metal-polymer laminate of the present invention is laminated with a similar single-sided metal-polymer laminate or any other laminate, and electronic component parts are mounted on at least one surface of the multi-layered parts-mounted circuit board.

In the practice of the method of making the double-sided metal-polymer laminate according to the present invention, a metal foil is applied to and is then hot-pressed to one of opposite surfaces of the liquid crystal polymer layer of a single-sided metal-polymer laminate remote from the metal foil to thereby complete the double-sided metal-polymer laminate. The double-sided metal-foil laminate of the present invention is manufactured in this manner.

The apparatus for making the single-sided metal-polymer laminate according to the present invention comprises a hot-press device for hot-pressing the liquid crystal polymer film sandwiched between first and second metal foils in a layered structure in a direction across the thickness of the liquid crystal polymer film, and a separating device for separating the resultant double-sided metal-polymer laminate into first and second single-sided metal-polymer laminates along a plane intermediate of the thickness of the double-sided metal-polymer laminate.

As hereinbefore discussed, one of the important features of the present invention lies in the utilization of the intra-layer separability owned by the liquid crystal polymer layer, that is, the capability of the liquid crystal polymer layer being separated internally into two polymer plies, so that the intended single-sided metal-polymer laminate can be obtained without allowing the unique intra-layer separability to be lost during the manufacture thereof For this purpose, it is essential that the liquid crystal polymer layer even though softened is not caused to melt and, therefore, the temperature of the liquid crystal polymer layer should not exceed the melting point thereof However, the liquid crystal polymer layer does not always has a fixed melting point, and the melting point thereof may vary depending on the thermal history applied to the liquid crystal polymer layer. By way of example, if the liquid crystal polymer film or layer is placed in the atmosphere of a temperature close to, but lower than the melting point thereof (for example, consistently in the atmosphere of a temperature lower by 15° C. than the melting point thereof), the melting point at the starting time will increase with time and will finally increase to a value higher by about 120° C. than the melting point thereof at the starting time. Thus, at the time the melting point of the liquid crystal polymer film or layer has increased to the temperature higher than that at the starting time, the intra-separability of the liquid crystal polymer film or layer will not be lost provided that it is heated to a temperature lower than the increased melting point thereof.

In the practice of the present invention, the hot-pressing may be carried out by the use of a hot-press machine, a vacuum hot-press machine, or a hot roll press. Alternatively, a press machine, a vacuum press machine or a roll press, each having a separate heating means installed substantially adjacent thereto, can be used.

The single-sided metal-foil laminate of the present invention can be used not only as a material for circuit substrates, but also in a variety of applications in which laminates of general-purpose plastics with metal foils are employed. However, particularly where the single-sided metal-foil laminate of the present invention is used as a material for circuit substrates, it is desirable that the physical property such as the thermal expansion coefficient of the liquid crystal polymer film in a film forming direction is equal to or substantially equal to that in a direction perpendicular to the film forming direction. Considering, however, that the liquid crystal polymer molecules tend to be easily oriented, formation of the liquid crystal polymer film with the standard film forming method would result in that the liquid crystal polymer forming the film will have its molecules strongly oriented (with SOR not smaller than 1.5) in the film forming direction. Where the liquid crystal polymer film having the molecules strongly oriented in the film forming direction is used as a material for the single-sided metal-polymer laminate, the liquid crystal polymer layer in the resultant single-sided metal-polymer laminate will have its molecules strongly oriented in the film forming direction as is the case with the raw material film and, therefore, the physical property such as the thermal expansion coefficient in the film forming direction will become different from that in the direction perpendicular to the film forming direction.

In view of the foregoing, the single-sided metal-polymer laminate for use as a material for the circuit substrates is preferably of a nature in which the liquid crystal polymer film used therein has an isotropy (with SOR not greater than 1.3, and ideally 1).

As hereinbefore discussed, the present invention is intended to provide the laminate comprising the electric insulating layer made of the liquid crystal polymer and the metallic foil layer, wherein the liquid crystal polymer layer can be made thin, and, in particular, to provide as a suitable material for the circuit substrates the laminate in which the electric insulating layer made of the liquid crystal polymer has an isotropic molecular orientation. Accordingly, the liquid crystal polymer layer used in the single-sided metal-polymer laminate of the present invention makes it possible to provide the circuit substrate comprising the thin liquid crystal polymer layer and the metal foil layer, which substrate has long been desired for, because of the feature of the thin thickness secured and because of the isotropic molecule orientation.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DETAILED DESCRIPTION OF THE INVENTION

Figure 1A:
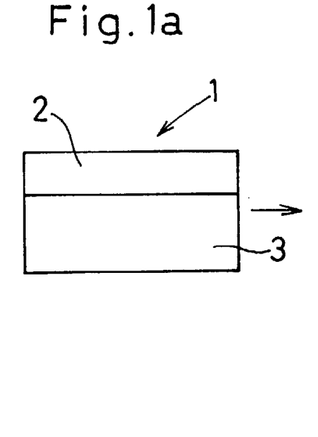
FIGS. 1a to 1c schematically illustrate the sequence of forming a coating on a base material with the use of an isotropic liquid crystal polymer film, showing a coating method according to a first preferred embodiment of the present invention.
Figure 1B:
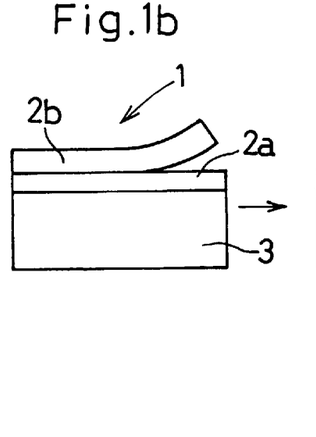
Figure 1C:
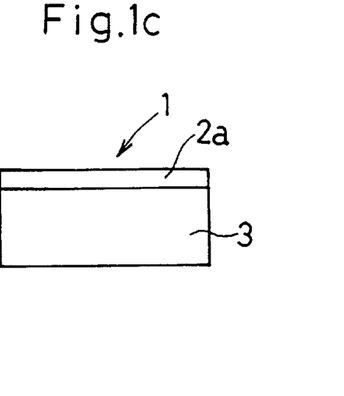

A method of forming a coating on a base material according to a first preferred embodiment of the present invention is shown in FIGS. 1a to 1c. As shown in FIG. 1a, a sheet-like coated material 1 comprises a liquid crystal polymer film 2 thermally bonded to a sheet-like base material 3. The liquid crystal polymer film 2 has a segment orientation ratio (SOR) not greater than 1.3 and has a thickness not smaller than 15 $\mu$m. The liquid crystal polymer film 2 is subsequently peeled off substantially as shown in FIG. 1b. Because of the advantageous utilization of the intra-layer separability of the liquid crystal polymer film 2, the peel-off process can be effected easily. The peeling of the liquid crystal polymer film 2 results in separation of the liquid crystal polymer film 2 into two thin liquid crystal polymer plies 2a and 2b with the liquid crystal polymer ply 2a left firmly bonded to the base material 3 while the ply 2b is being peeled off. After the liquid crystal polymer ply 2b has completely been peeled off, the liquid crystal polymer ply 2a remains bonded firmly to the base material 3 to thereby form the coated material 1 as shown in FIG. 3c.

In this way, the coated material 1 including a liquid crystal polymer coating having the SOR not greater than 1.3 and a thickness not greater than 15 $\mu$m can easily be obtained owing to the advantageous utilization of the intra-layer separability of the liquid crystal polymer film.

Figure 2A:
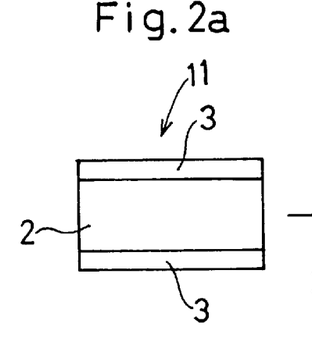
FIGS. 2a to 2g schematically illustrate the sequence of formation of a single-sided metal-polymer laminate, showing a laminate forming method according to a second preferred embodiment of the present invention.
Figure 2B:
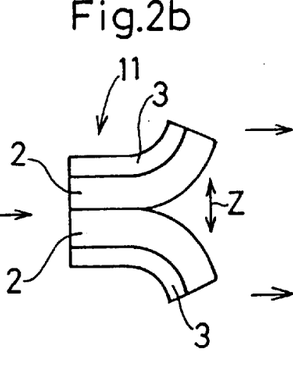
Figure 2C:
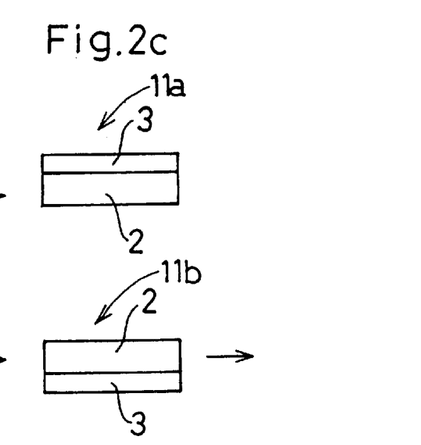

A method of making the single-sided metal-polymer laminate according to a second preferred embodiment of the present invention is shown in FIGS. 2a to 2g. A double-sided metal-polymer laminate 11 comprising the liquid crystal polymer film 2 having its opposite surfaces thermally bonded with upper and lower metal foil layers 3 as shown in FIG. 2a is divided, as shown in FIG. 2b, along a plane intermediate of the thickness of the double-sided metal-polymer laminate 11 so as to separate the liquid crystal polymer film 2 in a thicknesswise direction indicated by Z to provide first and second single-sided metal-polymer laminates 11a and 11b, as shown in FIG. 2c, each comprising a divided liquid crystal polymer layer 2 and the upper or lower metal foil layer 3.

The process of division shown in FIG. 2b is carried out by the utilization of the intra-layer separability of the liquid crystal polymer film as is the case with the foregoing embodiment and can therefore be easily carried out. The method so far described with reference to FIGS. 2a to 2c does not require the use of the expensive release film hitherto required in the practice of the prior art method and is effective to provide the two single-sided metal-polymer laminates simultaneously.

Figures 2D, 2E:
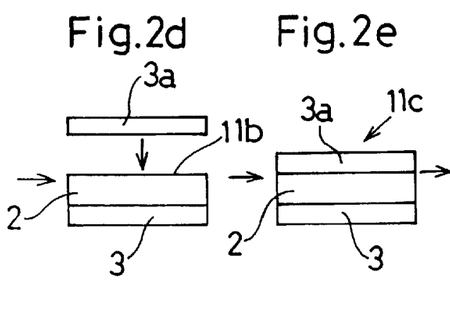

Either of the resultant single-sided metal-polymer laminates, for example, the single-sided metal-polymer laminate 11b, may further be provided with a similar or different metal foil 3a hot-pressed to one of opposite surfaces of the liquid crystal polymer film layer 2 remote from the lower metal foil layer 3 as shown in FIG. 2d to provide the double-sided metal-polymer laminate 11c as shown in FIG. 2e. However, the double-sided metal-polymer laminate 11c so obtained comprises the liquid crystal polymer layer 2 of a thickness substantially half the thickness thereof in the starting double-side metal-polymer laminate 11 shown in FIG. 2a.

Figure 2F:
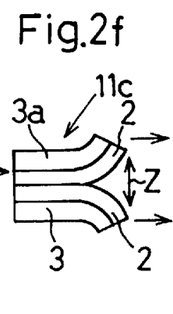
Figure 2G:
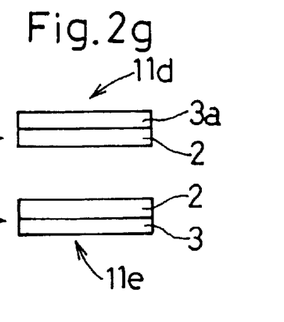

The double-sided metal-polymer laminate 11c is subsequently subjected to the peel-off process as shown in FIG. 2f to separate the liquid crystal polymer layer 2 along a plane intermediate of the thickness thereof in the thicknesswise direction Z to provide first and second single-sided metal-polymer laminates 11d and 11e, as shown in FIG. 2g, each comprising a divided liquid crystal polymer layer 2 and the upper or lower metal foil layer 3a or 3. By repeating the process of method steps shown in FIGS. 2d to 2g, it will readily be understood that the thickness of the liquid crystal polymer layer 2 can further be reduced.

Figure 3:
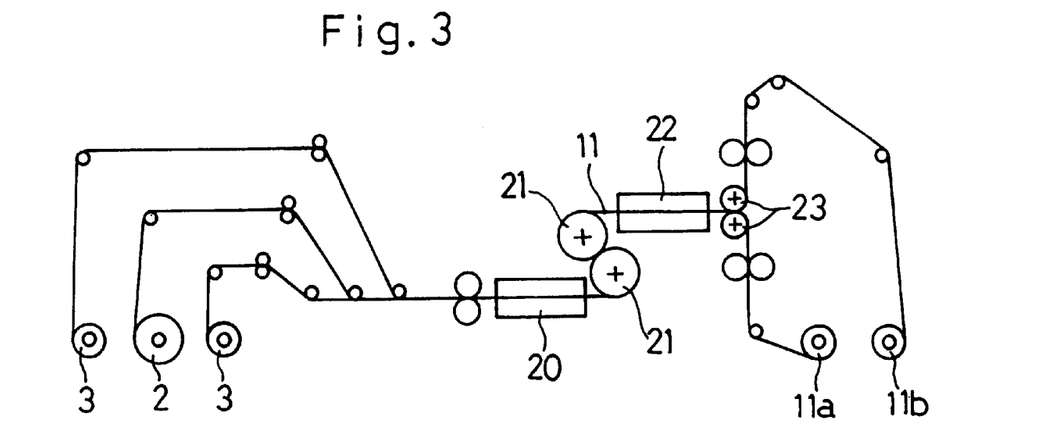
FIG. 3 is a schematic front elevational view showing an apparatus for making the single-sided metal-polymer laminate according to the present invention.

FIG. 3 schematically illustrates an apparatus for making the single-sided metal-polymer laminate according to the present invention described above. Referring now to FIG. 3, the upper metal foil 3, the liquid crystal polymer film 2 and the lower metal foil 3, all of which are a raw material for any one of the single-sided metal-polymer laminates 11a and 11b, are overlapped with the liquid crystal polymer film 2 intervening between the upper and lower metal foils 3, 3 to thereby provide a sandwich structure. This sandwich structure is subsequently passed through a preheating chamber 20 at which the upper and lower metal foils 3, 3 and the liquid crystal polymer film 2 are preheated to the same temperature. The preheated sandwich structure is then passed through a nipping region between heated rollers 21, 21, which form a hot press, so that the upper and lower metal foils 3, 3 with the liquid crystal polymer film 2 intervening therebetween can be hot-pressed together to thereby provide the double-sided metal-polymer laminate 11. The resultant double-sided metal-polymer laminate 11 is thereafter passed through a temperature-controlled chamber 22 for adjusting the temperature of the double-sided metal-polymer laminate 11 to a value suitable for eventual separation of the double-sided metal-polymer laminate 11 into two single-sided metal-polymer laminates as will be described later.

The temperature-adjusted double-sided metal-polymer laminate 11 emerging outwardly from the temperature-controlled chamber 22 is then supplied to a separating device 23 by which the double-sided metal-polymer laminate 11 is divided along a plane intermediate of the thickness of the liquid crystal polymer layer 2 to thereby provide the first and second single-sided metal-polymer laminates 11a and 11b which are subsequently wound around respective take-up rolls.

Figure 4:
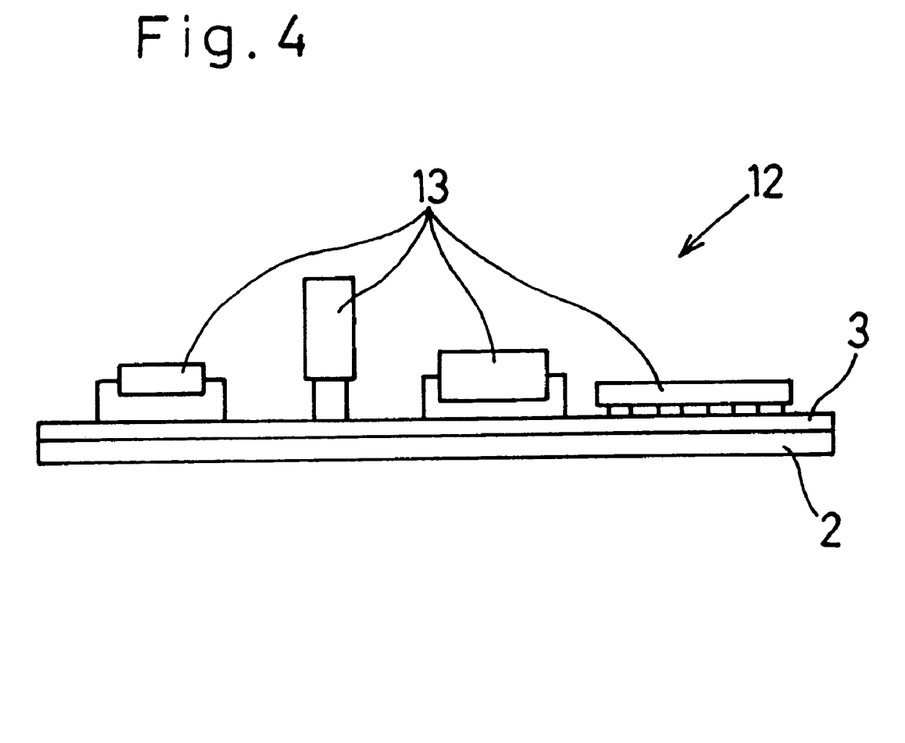
FIG. 4 is a schematic side view of a parts-mounted circuit board according to a third preferred embodiment of the present invention.

The third preferred embodiment of the present invention is directed to a parts-mounted circuit board 12 which is conceptually shown in FIG. 4. Referring to FIG. 4, this parts-mounted circuit board 12 is prepared from the single-sided metal-polymer laminate 11a or 11b which is shown in FIG. 2c and in which the metal foil 3 is made of copper, and has an electric circuit formed thereon by etching off a portion of the copper foil 3 in the parts-mounted circuit board 12 other than an area having one or more printed patterns of electric circuits. Electronic component parts 13 such as resistors, coils, capacitors and IC components are surface-mounted on the circuit board 12 and electrically connected with the circuit patterns. Since the present invention makes it possible to reduce the thickness of the liquid crystal polymer layer 2 which serves as an electric insulating layer, the single-sided metal-polymer laminate 11a is effective to provide the parts-mounted circuit board 12 of a reduced thickness.

Figure 5:
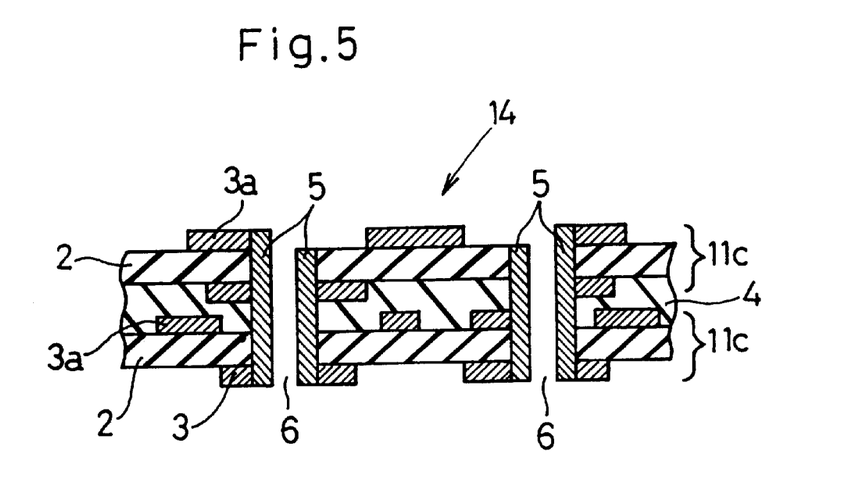
FIG. 5 is a schematic side sectional view of a multi-layered circuit board according to a fourth preferred embodiment of the present invention.

The multi-layered circuit substrate 14 according to the fourth preferred embodiment of the present invention will now be described with reference to FIG. 5. As shown schematically therein, the multi-layered circuit substrate 14 comprises a liquid crystal polymer film 4 firmly sandwiched between two double-sided metal-polymer laminates 11c of the structure shown in FIG. 2e. The metal foils 3 employed in each of the double-sided metal-polymer laminates 11c is made of copper. Each of those double-sided metal-polymer laminates 11c has an electric circuit formed thereon by etching off a portion of the respective copper foil 3 other than an area having one or more printed patterns of electric circuits. After the liquid crystal polymer film 4 has been sandwiched between these double-sided metal-polymer laminates 11c, the resultant sandwich structure is hot-pressed to provide the multi-layered circuit substrate 14 which is subsequently perforated across the thickness thereof to have a plurality of through-holes. An internal wall surface of each of said through-holes are finally plated at 5 to complete the plated through-holes 6 for receiving terminal elements of electronic component parts. Since the present invention makes it possible to reduce the thickness of the liquid crystal polymer layer 2 which serves as an electric insulating layer, the double-sided metal-polymer laminates 11c are effective to provide the multi-layered circuit substrate 14 of a reduced thickness.

Hereinafter, the present invention will be demonstrated by way of some examples which are set forth only for illustrative purpose and are not for limiting the scope of the present invention.

EXAMPLE I

A thermotropic liquid crystal polyester containing 27 mol % of units from 6-hydroxy-2-naphthoic acid and 73 mol % of units from p-hydroxybenzoic acid was heat-kneaded through a single-screw extruder at a temperature of 280 to 300° C. and was then extruded through an inflation die, 40 mm in diameter and 0.6 mm in slit size, to produce a liquid crystal polymer film having a thickness of 75 μm. The resultant liquid crystal polymer film had a melting point of 280° C. and a segment orientation ratio (SOR) of 1.2. An aluminum foil (the base material to be coated) having a thickness of 200 μm and the resultant liquid crystal polymer film were, after having been overlapped one above the other, heat-pressed between upper and lower heated plates of a vacuum flat-bed hot press, evacuated to 40 mmHg, at a temperature of 275° C. under a pressure of 20 Kg/cm², followed by separation that was carried out so as to allow a portion of the liquid crystal polymer film to be left on the aluminum foil.

Thereafter, the aluminum foil is etched off by the use of a chemical etching technique to give a liquid crystal polymer coating layer. Measurement of the resultant liquid crystal polymer coating layer has shown that it has a segment orientation ratio of 1.2 and a thickness of 30 μm.

For comparison purpose, the above described liquid crystal polymer was melted and coated on the same aluminum foil (the base material) by the use of a roll coater to provide a liquid crystal polymer coating layer. When this liquid crystal polymer coating layer was measured in the manner described above, the segment orientation ratio was 1.5.

EXAMPLE II

A thermotropic liquid crystal polyester containing 27 mol % of units from 6-hydroxy-2-naphthoic acid and 73 mol % of units from p-hydroxybenzoic acid was heat-kneaded through a single-screw extruder at a temperature of 280 to 300° C. and was then extruded through an inflation die, 40 mm in diameter and 0.6 mm in slit size, to produce a liquid crystal polymer film having a thickness of 20 μm. The resultant liquid crystal polymer film had a melting point of 280° C. and a segment orientation ratio (SOR) of 1.03.

The resultant liquid crystal polymer film as a material for the liquid crystal polymer coating layer and an electrolytic copper foil(the base material to be coated) having a thickness of 18 μm were, after having been overlapped one above the other, heat-pressed with the use of a vacuum flat-bed hot press in a manner similar to that in Example I and is then separated so as to allow a portion of the liquid crystal polymer film to be left on the copper foil, thereby to provide the liquid crystal polymer coating layer. After the electrolytic copper foil has been etched off by the use of the chemical etching technique, the liquid crystal polymer coating layer was measured, resulting in the segment orientation ratio of 1.03 and the thickness of 9 μm.

EXAMPLE III

A thermotropic liquid crystal polyester containing 27 mol % of units from 6-hydroxy-2-naphthoic acid and 73 mol % of units from p-hydroxybenzoic acid was heat-kneaded through a single-screw extruder at a temperature of 280 to 300° C. and was then extruded through an inflation die, 40 mm in diameter and 0.6 mm in slit size, to produce a liquid crystal polymer film having a thickness of 50 μm. The resultant liquid crystal polymer film had a melting point of 28020 C., a segment orientation ratio (SOR) of 1.02 and a thermal expansion coefficient of −8 ppm/° C.

The resultant liquid crystal polymer film as a material for the liquid crystal polymer coating layer and a rolled copper foil having a thickness of 10 μm and a thermal expansion coefficient of 18 ppm/° C., were, after having been overlapped one above the other, heat-pressed with the use of a vacuum flat-bed hot press in a manner similar to that in Example I and is then separated so as to allow a portion of the liquid crystal polymer film to be left on the copper foil, thereby to provide the liquid crystal polymer coating layer. After the rolled copper foil has been etched off by the use of the chemical etching technique, the liquid crystal polymer coating layer was measured, resulting in the segment orientation ratio of 1.02 and the thickness of 15 μm. The thermal expansion coefficient was found −8 ppm/° C.

EXAMPLE IV

The base material having the liquid crystal polymer coating layer obtained in Example III was heated to 292° C. with the use of an oven of a hot-air circulating type. The rolled copper foil was etched off by the use of the chemical etching technique. The resultant liquid crystal polymer coating layer has shown a segment orientation ratio of 1.02, a thickness of 15 μm and a thermal expansion coefficient of 18 ppm/° C.

EXAMPLE V

The same liquid crystal polymer film as that in Example III above, having the same thickness of 50 μm as that in Example III, was sandwiched between an electrolytic copper foil of 18 μm in thickness as an upper metal foil and an electrolytic copper foil of 18 μm in thickness as a lower metal foil and was heat-pressed by a vacuum flat-bed hot press, evacuated to 30 mmHg, at a press temperature of 270° C. under a pressure of 60 Kg/cm$^{2,}$ to produce a double-sided metal-polymer laminate having a thickness of 86 μm. The liquid crystal polymer film used had a segment orientation ratio of 1.02.

The resultant double-sided metal-polymer laminate was separated along a plane intermediate of the thickness thereof to provide two single-sided metal-polymer laminates. The liquid crystal polymer layer in each of those single-sided metal-polymer laminates showed a surface of separation which is smooth flat and free from fluffs. Each of the resultant single-sided metal-polymer laminates had a thickness of 43 μm and, since the single metal foil used had a thickness of 18 μm, the thickness of the liquid crystal polymer layer in each of the single-sided metal-polymer laminates was 25 μm, accordingly.

The metal foil in each of the single-sided metal-polymer laminate was then etched off by the use of the chemical etching technique to leave a film-like liquid crystal polymer layer which was found having a segment orientation ratio of 1.02, with no variation having consequently occurred in the segment orientation ratio.

EXAMPLE VI

By applying a force to upper and lower portions of the same double-sided metal-polymer laminate of 86 μm in thickness as that in Example V, which are adjacent the upper and lower metal foils, respectively, so as to separate the liquid crystal polymer layer upwardly and downwardly at a position different from Example V, a first laminate including the upper metal foil layer and a divided liquid crystal polymer layer and a second laminate including the lower metal foil and a divided liquid crystal polymer layer were prepared.

The first laminate had a thickness of 48 μm and, hence, the liquid crystal polymer layer of the first laminate had a thickness of 30 μm whereas the second laminate had a thickness of 38 μm and, hence, the liquid crystal polymer layer of the second laminate had a thickness of 20 μm.

The respective metal foil layers of the first and second laminates were subsequently etched off by the use of the chemical etching technique. Both of the resultant liquid crystal polymer layers in the first and second laminates had a segment orientation ratio of 1.02.

EXAMPLE VII

A thermotropic liquid crystal polyester containing 27 mol % of units from 6-hydroxy-2-naphthoic acid and 73 mol % of units from p-hydroxybenzoic acid was heat-kneaded through a single-screw extruder at a temperature of 280 to 300° C. and was then extruded through an inflation die, 40 mm in diameter and 0.6 mm in slit size, to produce a liquid crystal polymer film having a thickness of 16 μm. The resultant liquid crystal polymer film had a melting point of 280° C. and a segment orientation ratio (SOR) of 1.02.

The resultant liquid crystal polymer film of 16 μm in thickness was sandwiched between two electrolytic copper foils each having a thickness of 18 μm and then thermally bonded together with the use of a pair of hot press rolls heated to a roll temperature of 280° C. with a line pressure of 100 kg/cm to thereby provide a double-sided metal-polymer laminate comprising the upper and lower metal foil layers with the liquid crystal polymer layer sandwiched therebetween. This double-sided metal-polymer laminate had a thickness of 52 μm.

Thereafter, upper-side and lower-side portions of the double-sided metal-polymer laminate were separated in a manner that they were peeled away from each other by the application of a force thereto, to divide the liquid crystal polymer layer into upper and lower polymer layers, to thereby provide a first laminate including the upper metal foil layer and the upper liquid crystal polymer layer and a second laminate including the lower metal foil layer and the lower liquid crystal polymer layer.

The first laminate had a thickness of 26 μm and, hence, the liquid crystal polymer layer in the first laminate had a thickness of 8 μm whereas the second laminate had a thickness of 26 μm and, hence, the liquid crystal polymer layer in the second laminate had a thickness of 8 μm, as well.

The respective metal foil layers of the first and second laminates were subsequently etched off by the use of the chemical etching technique. Both of the resultant liquid polymer layers in the first and second laminates had a segment orientation ratio of 1.02.

EXAMPLE VIII

An electrolytic copper foil having a thickness of 18 μm is placed on the liquid crystal polymer layer of the laminate of 26 μm in thickness obtained in Example VII and is then heat-bonded thereto in a manner similar to that in Example VII to provide a laminate comprising the upper metal foil layer and a lower metal foil layer with the liquid crystal polymer layer sandwiched therebetween. This resultant laminate had a thickness of 44 μm.

Thereafter, upper-side and lower-side portions of the laminate of 44 μm were separated in a manner that they were peeled away from each other by the application of a force thereto, to divide the liquid crystal polymer layer into upper and lower polymer layers, to thereby provide a first laminate including the upper metal foil layer and the upper liquid crystal polymer layer and a second laminate including the lower metal foil layer and the lower liquid crystal polymer layer.

The first laminate had a thickness of 22 μm and, hence, the liquid crystal polymer layer in the first laminate had a thickness of 4 μm whereas the second laminate had a thickness of 22 μm and, hence, the liquid crystal polymer layer in the second laminate had a thickness of 4 μm, as well.

The respective metal foil layers of the first and second laminates were subsequently etched off by the use of the chemical etching technique. Both of the resultant liquid polymer layers in the first and second laminates had a segment orientation ratio of 1.02.

EXAMPLE IX

An electrolytic copper foil having a thickness of 18 μm is placed on the liquid crystal polymer layer of the laminate of 22 μm thickness obtained in Example VIII and is then heat-bonded thereto by the use of a hot press heated to a press temperature of 294° C. under a pressure of 20 kg/cm² to provide a laminate comprising the upper metal foil layer and a lower metal foil layer with the liquid crystal polymer layer sandwiched therebetween. This resultant laminate had a thickness of 40 μm. Thereafter, the metal foil layers in this laminate were subsequently etched off to define a circuit within an area of 15×15 mm, which circuit is thermally fitted to a semiconductor chip to thereby complete a parts-mounted circuit board.

EXAMPLE X

An electrolytic copper foil having a thickness of 18 μm placed on the liquid crystal polymer layer of the laminate of 22 μm thickness obtained in Example VIII and is then heat-bonded thereto by the use of a hot press heated to a press temperature of 294° C. under a pressure of 20 kg/cm² to provide two laminates each comprising the upper metal foil layer and a lower metal foil layer with the liquid crystal polymer layer sandwiched therebetween. Each of the resultant laminates had a thickness of 40 μm. Thereafter, a circuit pattern was formed by the use of an etching technique on the metal foil in each of the resultant laminates of 40 μm thickness. The same liquid crystal polymer film of 50 μm in thickness as that used in Example III was sandwiched between the two laminates having the respective circuit patterns formed thereon and was then heat-bonded together by the use of a hot press heated to a press temperature of 284° C. under a pressure of 10 kg/cm² to provide a single laminate of a multi-layered structure. Then, portions of the circuit patterns which eventually serve as terminal connections were drilled to form through-holes which were subsequently copper-plated by means of a crimson non-electrolytic plating method to thereby complete a multi-layered circuit substrate.

As hereinbefore fully described, the present invention is effective to provide a means for forming the isotropic liquid crystal polymer coating layer and, in particular, a means for forming the isotropic liquid crystal polymer coating layer having a thickness not greater than 15 μm and the isotropic liquid crystal polymer coating layer having a thermal expansion coefficient that is equal to or substantially equal to that of the base material.

Also, according to the present invention, the single-sided metal-polymer laminate utilizing the liquid crystal polymer can be manufactured with no need to use any release film hitherto required. For this reason, the cost hitherto incurred by the use of the release film can be eliminated. Also, since two single-sided metal-polymer laminates can be manufactured from the single double-sided metal-polymer laminate through a single process, the single-sided metal-polymer laminates according to the present invention can be produced at a speed substantially twice that required according to the prior art method, accompanied by increase in productivity.

In addition, as hereinbefore fully described, the present invention is effective to provide the laminate comprising the ultra-thin liquid crystal polymer layer and the metal foil layer and the laminate containing the liquid crystal polymer layer having a segment orientation ratio that is uniform in any direction in a plane.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:

1. A coating method which comprises the steps of:
   applying to a base material a polymer film prepared from a polymer capable of forming an optically anisotropic melt phase and having a segment orientation ratio of not greater than 1.3;
   heat-bonding the polymer film to the base material to provide a laminate; and
   peeling the film so as to leave a thin layer of the film on the base material.

2. A method of making a single-sided metal-polymer laminate which comprises the steps of:
   preparing a double-sided metal-polymer laminate including first and second metal foil layer and a layer of a polymer capable of forming an optically anisotropic melt phase, said polymer layer being sandwiched between the first and second metal foil layers; and
   dividing the double-sided metal-polymer laminate so as to separate the polymer layer in a thicknesswise direction to provide a first single-sided metal-polymer laminate including the first metal foil and a layer of the polymer capable of forming an optically anisotropic melt phase and a second single-sided metal-polymer laminate including the second metal foil and a layer of the polymer capable of forming an optically anisotropic metal phase,
   wherein said preparing step is carried out by sandwiching a film of the polymer capable of forming an optically anisotropic melt phase between the first and second metal foils in a layered fashion and hot-pressing them together at a temperature not higher than the melting point of said polymer.

3. A method of making a double-sided metal-polymer laminate, which method comprises the steps of:
   applying a metal foil to the polymer layer of the single-sided metal-polymer laminate prepared by preparing a double-sided metal-polymer laminate including first and second metal foil layer and a layer of a polymer capable of forming an optically anisotropic melt phase, said polymer layer being sandwiched between the first and second metal foil layers; and
   dividing the double-sided metal-polymer laminate so as to separate the polymer layer in a thicknesswise direction to provide a first single-sided metal-polymer laminate including the first metal foil and a layer of the polymer capable of forming an optically anisotropic melt phase and a second single-sided metal-polymer laminate including the second metal foil and a layer of the polymer capable of forming an optically anisotropic melt phase; and
   hot pressing the metal foil and the single-sided metal-polymer laminate together to provide the double-sided metal-polymer laminate.

4. The method according to claim 3, wherein the single-sided metal-polymer laminate is capable of forming an optically anisotropic melt phase and has a thickness not greater than 15 μm.

5. The method according to claim 3, wherein the layer of the polymer contained in the single-sided metal-polymer laminate and capable of forming the optically anisotropic melt phase has a segment orientation ratio of not greater than 1.3.

6. A method according to claim 3, wherein said single-sided metal-polymer laminate which comprises a layer of a polymer capable of forming an optically anisotropic melt phase has a thickness of not greater than 15 μm and has a metal foil layer bonded to one of opposite surfaces of the polymer layer, said layer of the polymer has a segment orientation ratio of not greater than 1.3.

* * * * *